United States Patent
Celanovic et al.

(10) Patent No.: US 7,482,610 B2
(45) Date of Patent: Jan. 27, 2009

(54) VERTICAL-CAVITY ENHANCED RESONANT THERMAL EMITTER

(75) Inventors: Ivan Celanovic, Somerville, MA (US); John G. Kassakian, Newton, MA (US); David J. Perrault, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 330 days.

(21) Appl. No.: 11/331,533

(22) Filed: Jan. 13, 2006

(65) Prior Publication Data

US 2006/0186357 A1    Aug. 24, 2006

Related U.S. Application Data

(60) Provisional application No. 60/643,756, filed on Jan. 13, 2005.

(51) Int. Cl.
| | |
|---|---|
| G21G 4/00 | (2006.01) |
| G01J 1/00 | (2006.01) |
| G01J 3/10 | (2006.01) |
| A61N 5/06 | (2006.01) |
| H05G 2/00 | (2006.01) |
| H01L 21/00 | (2006.01) |

(52) U.S. Cl. .............................. 250/504 R; 250/495.1; 250/493.1; 257/98; 438/72; 438/74; 313/506; 313/509

(58) Field of Classification Search .............. 250/503.1, 250/504 R, 495.1, 493.1; 313/110, 111, 313/113, 114, 315, 316, 501, 506, 507, 509; 257/98, 99, 431, 432; 438/54, 57, 66, 72, 438/74, 78; 445/50, 51

See application file for complete search history.

(56) References Cited

U.S. PATENT DOCUMENTS

| | | | |
|---|---|---|---|
| 6,583,350 B1 * | 6/2003 | Gee et al. ................... 136/253 |
| 6,611,085 B1 | 8/2003 | Gee et al. |
| 6,869,330 B2 * | 3/2005 | Gee et al. ...................... 445/50 |
| 7,078,697 B2 * | 7/2006 | Barker et al. ................. 250/343 |
| 7,178,235 B2 * | 2/2007 | Rolston et al. ................ 29/860 |
| 7,195,944 B2 * | 3/2007 | Tran et al. ..................... 438/46 |
| 7,251,402 B2 * | 7/2007 | Akiyama et al. ............. 385/125 |
| 7,291,010 B2 * | 11/2007 | Perlo et al. ................... 431/326 |
| 2003/0071564 A1 | 4/2003 | Hirayama |
| 2004/0264530 A1 * | 12/2004 | Ryou et al. .................... 372/44 |
| 2005/0121820 A1 * | 6/2005 | Rolston et al. ............... 264/162 |

(Continued)

OTHER PUBLICATIONS

Fleming et al., "All-metallic three-dimensional photonic crystals with a large infrared bandgap" 2002 Macmillan Magazines Ltd., vol. 417, pp. 52-55.

(Continued)

*Primary Examiner*—Bernard E Souw
(74) *Attorney, Agent, or Firm*—Gauthier & Connors LLP

(57) ABSTRACT

A thermal emitter device includes a cavity structure that comprises an active medium for allowing thermal emissions to occur. A photonic crystal structure is positioned on one side of the cavity structure. The photonic crystal structure comprises alternating layers of high index and low index materials and acts as a first mirror for the cavity structure. A highly reflective mirror structure is positioned on another side of the cavity structure and acting as both the high-temperature source of radiation and a second mirror for the cavity structure.

33 Claims, 8 Drawing Sheets

U.S. PATENT DOCUMENTS

| | | | |
|---|---|---|---|
| 2005/0142512 A1* | 6/2005 | Perlo et al. | 431/326 |
| 2005/0238561 A1* | 10/2005 | Beier et al. | 423/338 |
| 2006/0076518 A1* | 4/2006 | Barker et al. | 250/504 R |
| 2006/0157721 A1* | 7/2006 | Tran et al. | 257/98 |
| 2006/0186357 A1* | 8/2006 | Celanovic et al. | 250/504 R |
| 2007/0053651 A1* | 3/2007 | Akiyama et al. | 385/147 |
| 2007/0228404 A1* | 10/2007 | Tran et al. | 257/98 |
| 2008/0211048 A1* | 9/2008 | Rolston et al. | 257/433 |

OTHER PUBLICATIONS

Hitoshi et al., "Spectral control of thermal emission by periodic microstructured surfaces in the near-infrared region" 2001 Optical Society of America, vol. 18, No. 7, Jul. 2001, pp. 1471-1476.

Narayanaswamy et al., "Thermal emission control with one-dimensional metallodielectric photonic crystals" 2004 The American Physical Society, Physical Review B, 70, 2004, pp. 125101-1-125101-4.

Greffet et al., "Coherent emission of light by thermal sources" 2002 Macmillan Magazine Ltd., vol. 416, Mar. 2002, pp. 61-64.

Cornelius et al., "Modification of Planck blackbody radiation by photonic band-gap structures" Physical Review A, vol. 59, No. 6, Jun. 1999, pp. 4736-4746.

Yablonovitch, "Inhibited Spontaneous Emission in Solid-State Physics and Electronics" The American Physical Society, Physical Review Letters, vol. 58, No. 20, May 18, 1987, pp. 2059-2062.

Celanovic et al., "Resonant-cavity enhanced thermal emission" Physical Review B 72, The American Physical Society, 2005 pp. 075127-1 to 075127-5.

Lee et al., "Coherent thermal emission from one-dimensional photonic crystals" Applied Physics Letters, 87, 2005 American Institute of Physics, pp. 071904-1 to 071904-3.

Trupke et al., "Comment on Three Dimensional photonic-crystal emitter for thermal photovoltaic power generation" Applied Physics Letters, vol. 84, No. 11, 2004 American Institute of Physics, pp. 1997-1998.

Celanovic et al., "Design and optimization of one-dimensional photonic crystals for thermophotovoltaic applications" Optics Letters, Apr. 15, 2004, vol. 29, No. 8, pp. 863-865.

Kollyukh et al., "Thermal radiation of plane-parallel semitransparent layers" Science Direct, Optics Communications 225 (2003) pp. 349-352.

Patrini et al., "Optical response of one-dimensional (Si/SiO)2 $m$ photonic crystals" Journal of Applied Physics, vol. 92, No. 4, American Institute of Physics, pp. 1816-1820.

Greffet et al., "Coherent emission of light by thermal sources" Nature Publishing Group, London, vol. 416, No. 6876, Mar. 7, 2002, pp. 61-64.

Kreiter et al., "Thermally induced emission of light from a metallic diffraction grating, mediated by surface plasmons" Optics Communications, Elsevier, Sep. 1, 1999, pp. 117-122.

Heinzel et al., "Microstructured Tungsten Surfaces as Selective Emitters" AIP Conference Proceedings, American Institute of Physics, New York, No. 460, pp. 191-196.

* cited by examiner

VERTICAL-CAVITY ENHANCED RESONANT THERMAL EMITTER

PRIORITY INFORMATION

This application claims priority from provisional application Ser. No. 60/643,756 filed Jan. 13, 2005, which is incorporated herein by reference in its entirety.

BACKGROUND OF THE INVENTION

The invention relates to the field of bulk thermal radiation emitters, and in particular to a vertical-cavity enhanced resonant thermal emitter (VERTE).

Bulk thermal emission sources are commonly perceived as isotropic, broad-band and incoherent electromagnetic radiation sources. Although different bulk materials exhibit different emission characteristics, tailoring emission properties require engineering new material systems and structures that interact with sources of radiation (fluctuating thermal sources) on a wavelength scale. Indeed, structures with feature sizes on the order of radiation wavelengths (such as photonic crystals (PhC)) exhibit qualitatively different radiation behavior due to intricate interaction between the radiation and the matter. The ability to modulate photonic density of states and hence modify spontaneous emission rates in photonic crystals opens immense possibilities for designing novel thermal sources.

A majority of the previous work on thermal radiation properties of 1D, 2D and 3D photonic crystals investigates the suppression and enhancement of thermal emission for wide range of wavelengths. However, in this work the invention is particularly interested in narrow-band, antenna-like thermal emission from PhC structures. Previously, it was shown that surface patterned materials (with surface grating or 2D photonic crystal) that support surface polaritons (plasmon-polariton or phonon-polariton) can have narrow angular and narrow-band thermal radiation properties resulting in increased spatial and temporal coherence in the far-field and. Thermal emission properties of these structures allow certain degrees of freedom in adjusting the emission peak wavelength and directionality. Antenna-like emission patterns were also noticed with even simple planar structures like thin-film emitters. In 3D tungsten PhC, strong resonant enhancement near the band-edge was observed which can also suggest increased spatial coherence. Yet this structure shows a large emissivity outside the photonic bandgap which makes it unsuitable for applications that require highly selective emission properties.

SUMMARY OF THE INVENTION

According to one aspect of the invention, there is provided a narrow-frequency thermal emission device. The thermal emitter device includes a cavity structure that comprises a transparent medium, a highly reflective, non-absorbing structure and a highly reflective yet slightly absorbing mirror structure for allowing thermal emissions to occur. A highly reflective, non-absorbing structure is positioned on one side of the cavity structure. A highly reflective, yet slightly absorbing mirror structure is positioned on another side of the cavity structure and acting as both the high-temperature source of thermal radiation and a second mirror for the cavity structure. A resonant cavity effect allows for almost monochromatic enhancement of the thermal radiation emanating from the highly reflective and absorbing mirror.

According to another aspect of the invention, there is provided a method of forming a thermal emitter device. The method includes providing a cavity structure that comprises an active medium for allowing thermal emissions to occur. A highly reflective, non-absorbing structure is positioned on one side of the cavity structure. Also, the method includes positioning a highly reflective, yet slightly absorbing mirror structure on another side of the cavity structure and acting as both the high-temperature source of radiation and a second mirror for the cavity structure. A highly reflective mirror can be heated by means of resistive heating by applying a voltage to the mirror structure or by other means including combustion heating or putting it in contact with other heat sources.

According to another aspect of the invention, there is provided a thermal emitter device. The thermal emitter device includes a cavity structure that comprises an active medium for allowing thermal emissions to occur. A photonic crystal structure is positioned on one side of the cavity structure. The photonic crystal structure comprises alternating layers of high index and low index materials and acts as a first mirror for the cavity structure. A highly reflective mirror structure is positioned on another side of the cavity structure and acting as both the high-temperature source of radiation and a second mirror for the cavity structure.

According to another aspect of the invention, there is provided a method of forming a thermal emitter device. The method includes providing a cavity structure that comprises an active medium for allowing thermal emissions to occur. A photonic crystal structure is positioned on one side of the cavity structure. The photonic crystal structure comprises alternating layers of high index and low index materials and acts as a first mirror for the cavity structure. Also, the method includes positioning a highly reflective mirror structure on another side of the cavity structure and acting as both the high-temperature source of radiation and a second mirror for the cavity structure.

DETAILED DESCRIPTION OF THE PREFERRED IMBODIMENTS

The invention presents a new thermal emitter, quasi-monochromatic, highly directional, with tunable emission peak resonance and tunable directionality, referred to as a vertical-cavity enhanced resonant thermal emitter (VERTE). The initial motivation was to use an optical cavity resonance to resonantly enhance thermal radiation generated by fluctuating thermal sources in the cavity while suppressing it elsewhere. The design was inspired by the vertical cavity surface emitting laser (VCSEL).

Figure 1:
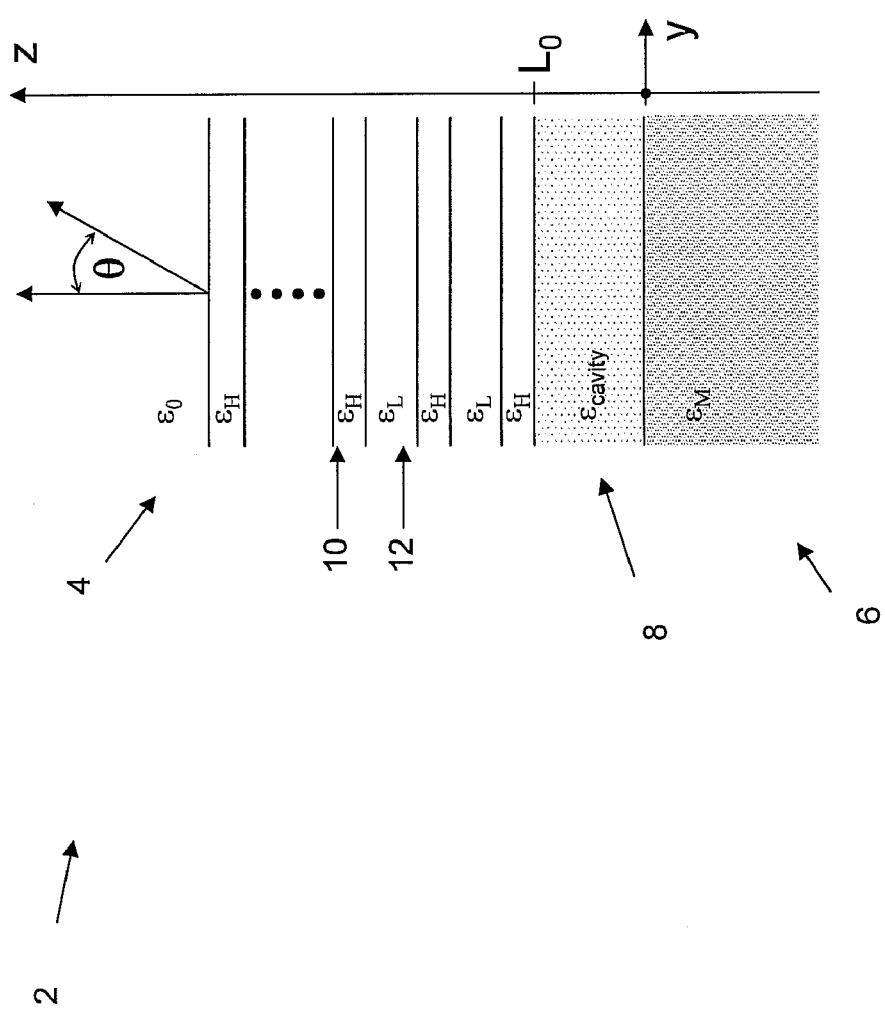
FIG. 1 is a schematic diagram demonstrating a cross-sectional view of vertical-cavity enhanced resonant thermal emitter (VERTE)

However, unlike the VCSEL, where the active medium is embedded in the cavity between the two 1D photonic crystals (PhC), this particular embodiment of the inventive VERTE 2 comprises a cavity 8 sandwiched between a partially reflective 1D PhC 4, a substantially non-reflective structure, on one side and a highly reflective metallic mirror 6 on the other side, as shown in FIG. 1. Ideally, the 1D PhC 4 and the cavity 8 are lossless, they are highly transparent in the range of wavelengths that are of interest, while the metallic mirror 6 is highly reflective yet slightly absorbing, thus acting as both the high-temperature source of radiation and the cavity 8 mirror. The cavity structure, with its strong frequency dependant transfer function, enhances thermal emission originating from the metallic mirror 6 building up a strong quasi-monochromatic field while suppressing non-resonant frequencies.

Two particular embodiments of the inventive vertical-cavity enhanced resonant thermal emitter designs are presented for the illustrative purpose; namely with tungsten and with silver as metallic mirrors. The cavity 8 in both designs is made from $SiO_2$ with thickness of $L_0$=0.78 µm which is taken here just for the illustrative purpose. Nevertheless, this design is not limited to particular choice of materials nor to the particular dimensions of the presented structure. The 1D PhC 4, acting as the top mirror, is made out of alternating quarter-wave layers 10, 12 of Si and $SiO_2$ where $d_H$=0.17 µm and $d_L$=0.39 µm are layer thicknesses respectively. For the time being both Si and $SiO_2$ are considered lossless dielectrics with refractive indices of $n_H$=3.34 and $n_L$=1.45 respectively. One can use the shorthand notation where a Si quarter-wave layer 10 is denoted with H (high-refractive index), and a $SiO_2$ quarter-wave layer 12 with L (low-refractive index), and where system of n pairs of layers can be represented as $(HL)^n$. In this particular design, the PhC mid-bandgap is at λ=2.35 µm, which approximately determines resonant wavelength of the structure. The cavity 8 and the bandgap design can easily be scaled in the wavelength region of interest allowing for a tunable thermal emitter source.

Thermal emission from the multi-layer structure like VERTE can relatively easily be calculated using the fluctuation-dissipation theorem. Yet, one will use Kirchhoff's law to calculate the directional polarized emittance by means of the directional polarized absorptance. Indeed, emittance ϵ can be expressed as ϵ=1−R where R is the reflectance of the structure. To calculate the reflectance one can use the transfer matrix approach, while for detailed resonant cavity design and parametrization one can use lumped parameter models of transmission lines and perturbation theory.

One can initially approach the analysis of the emitter from the photonic crystal perspective using some of the formalisms already developed for photonic crystals. To develop understanding of the resonant thermal emission and to further develop the intuition one can use the notion of the projected band diagram of an infinite 1D photonic crystal with a defect state. Indeed, one can treat this geometry as a cavity (double layer 8) surrounded on both sides by 1D photonic crystal mirrors. The projected photonic band diagram of an infinite 1D PhC composed of alternating quarter-wave layers of Si and $SiO_2$ with one double-layer of $SiO_2$ (defect), calculated using the BandSolve software package, is shown in FIG. 2.

For a given frequency (ω) and parallel wave vector $k_y$, the projected band diagram shows whether or not there exists a propagating electromagnetic mode in the z direction. Shaded regions in ω−$k_y$ space in FIG. 2 designate the existence while white regions designate the absence of propagating modes.

Figure 2:
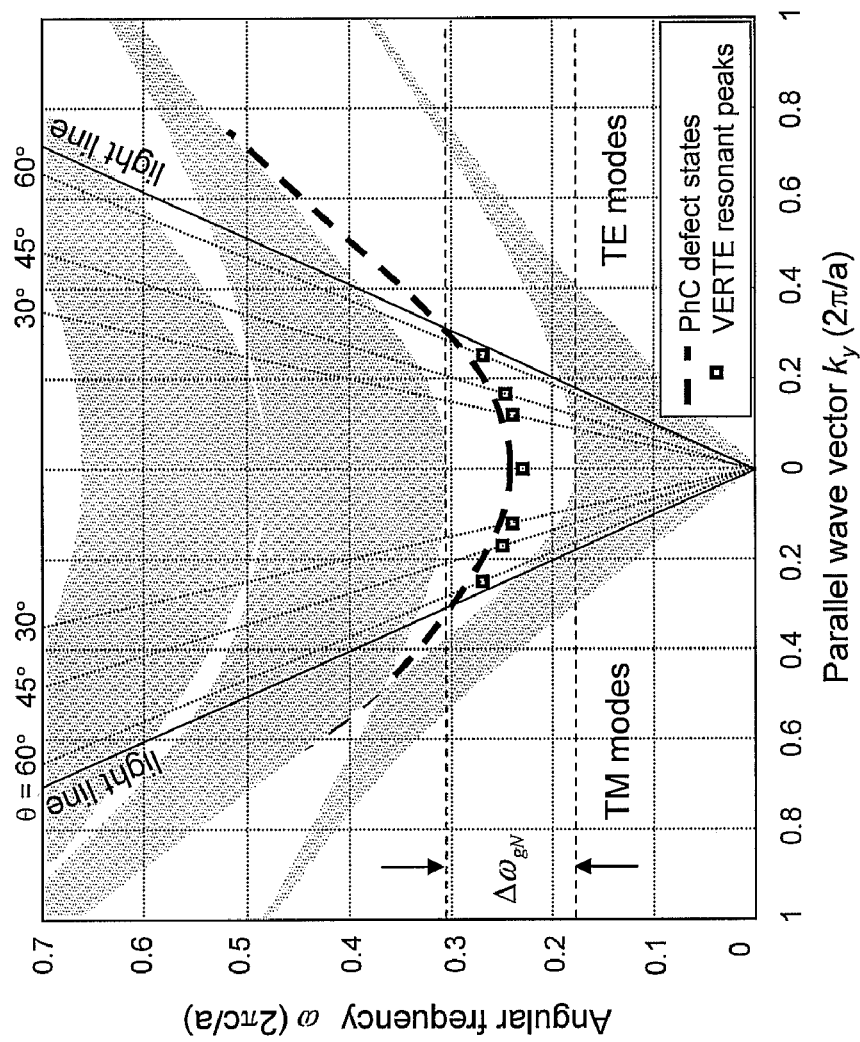
FIG. 2 is a projected band diagram of a 1D photonic crystal with a defect state and VERTE projected resonant modes.

The defect in the structure (cavity layer) creates defect states in the band gap, as shown with the dashed line in FIG. 2. The bandgap defect states are used as the radiation modes of the structure. Coupling defect states to the free space modes permits far-field resonant radiation that is highly directional, quasi-monochromatic thus quasi-coherent.

Although an infinite 1D PhC is a useful tool for developing intuition, it is not suitable for practical implementation of thermal radiation sources since dielectric layers are ideally lossless and it would be difficult to locally heat a lossless PhC structure. Therefore, the 1D PhC is replaced on one side of the defect with the lossy metallic mirror. The metallic mirror is at the same time a source of thermal radiation (although with very low emittance, typically below 10%) and as a cavity mirror. The notion of defect states can still be used, yet one should be cautious. In the bandgap, a metallic mirror can not radiate except through resonant modes. The position of resonant modes is slightly shifted to smaller frequencies due to the complex impedance of a metallic mirror, yet the shape and curvature remain qualitatively the same. Heating can occur by resistive heating the metallic mirror by applying a voltage or heating the metallic mirror with a combustion heat or other heat source. Therefore, to fully quantify behavior of resonant emission from the VERTE, the cavity is analyzed with the use of perturbation theory.

The resonant cavity quality factor, assuming that losses in the cavity are small, can be conveniently expressed as:

$$\frac{1}{Q(\theta)} = \frac{1}{Q_I(\theta)} + \frac{1}{Q_E(\theta)} \qquad \text{Eq. 1}$$

where $Q_I(\theta)$ is the internal quality factor related to the power dissipation within the resonant structure, $Q_E(\theta)$ is the external quality factor that depends on the coupling of the resonator to the outside world and θ is the angle of incidence. External quality factor is defined as: $Q_E=\omega_0 w_T/P_E$ where $w_T$ is the energy stored in the resonator and $P_E$ is the power lost to the external circuit. Similarly, internal quality factor is defined as: $Q_I=\omega_0 w_T/P_I$ where $w_T$ is the energy stored in the resonator and $P_I$ is the power lost internally in the resonator. At resonance, the cavity reflectance is given as:

$$|\Gamma(\theta)|^2 = \frac{Q_I(\theta) - Q_E(\theta)}{Q_I(\theta) + Q_E(\theta)} \qquad \text{Eq. 2}$$

and therefore the zero reflectance condition reduces to the condition that the internal and the external quality factors of the cavity must be equal ($Q_I=Q_E$) for a given angle (θ). Indeed, this is true if ($P_I=P_E$)

This condition can be achieved by adjusting the 1D photonic crystal transmittance, by changing the number of dielectric layers, to be equivalent to the metallic mirror absorptance. The reflectance of a quarter-wave dielectric stack structure designated as Air-L(LH)$^n$-L, near the center of the bandgap, for normal incidence (θ=0), and for odd number of layers can be expressed as:

$$|\Gamma|^2 = \left( \frac{n_H \left(\frac{n_H}{n_L}\right)^n - 1}{n_H \left(\frac{n_H}{n_L}\right)^n + 1} \right)^2 \qquad \text{Eq. 3}$$

while for the structure with an even number of quarter-wave layers designated as Air-L(LH)$^n$-L the reflectance is given as:

$$|\Gamma|^2 = \left(\frac{n_H\left(\frac{n_L}{n_H}\right)^n - 1}{n_H\left(\frac{n_L}{n_H}\right)^n + 1}\right)^2 \qquad \text{Eq. 4}$$

On the other hand, absorption in the metallic layer $A_M$ can be calculated in terms of impedances:

$$A_M = 1 - |\Gamma_m|^2 = 1 - \left(\frac{Z_M - Z_L}{Z_M + Z_L}\right)^2 \qquad \text{Eq. 5}$$

where $Z_M$ is the impedance of the metallic mirror and $Z_L$ is the impedance of the cavity layer (SiO$_2$). Adjusting the number of layers n in order to get $A_M$=1-|Γ|$^2$ results in unity emittance at the resonance. For smaller index contrast between dielectric layers it is easier to fine tune the number of layers so that $A_M$=1-|Γ|$^2$, yet the stop band of the photonic crystal is narrower.

Figure 3:
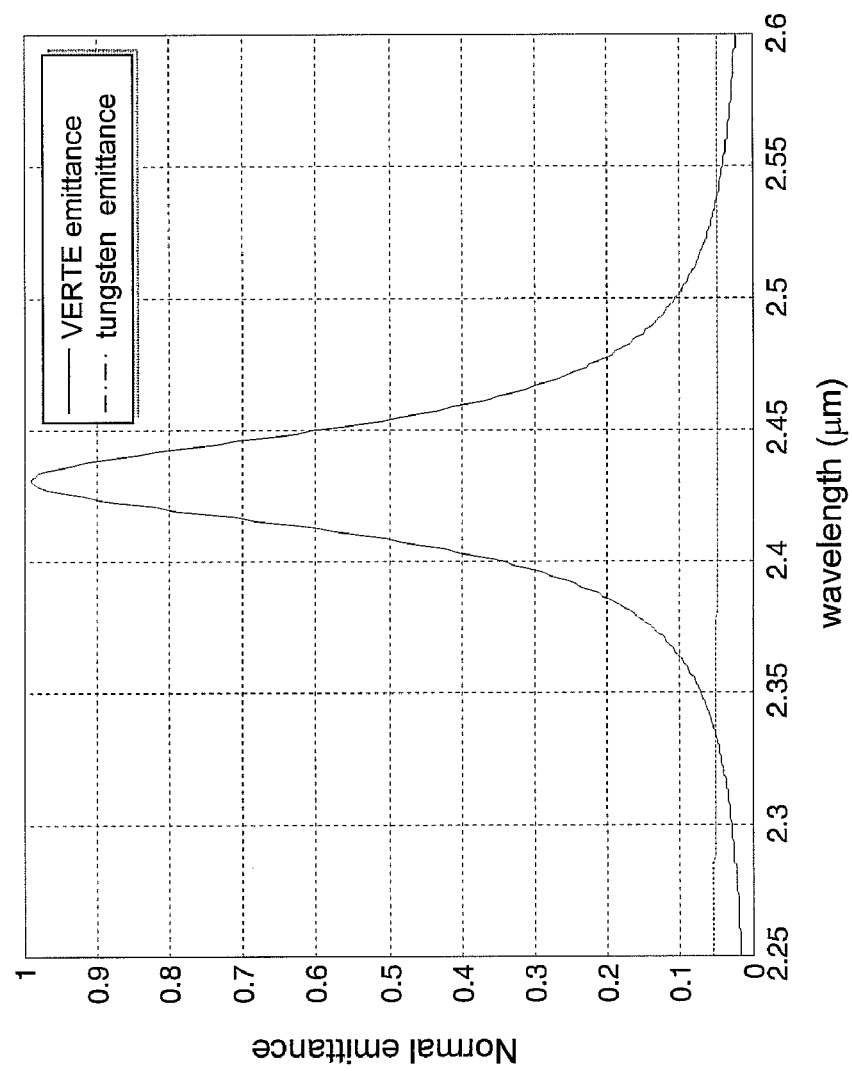
FIG. 3 is a graph demonstrating the normal emittance of vertical-cavity enhanced resonant thermal emitter with tungsten and normal emittance of planar tungsten.
Figure 4:
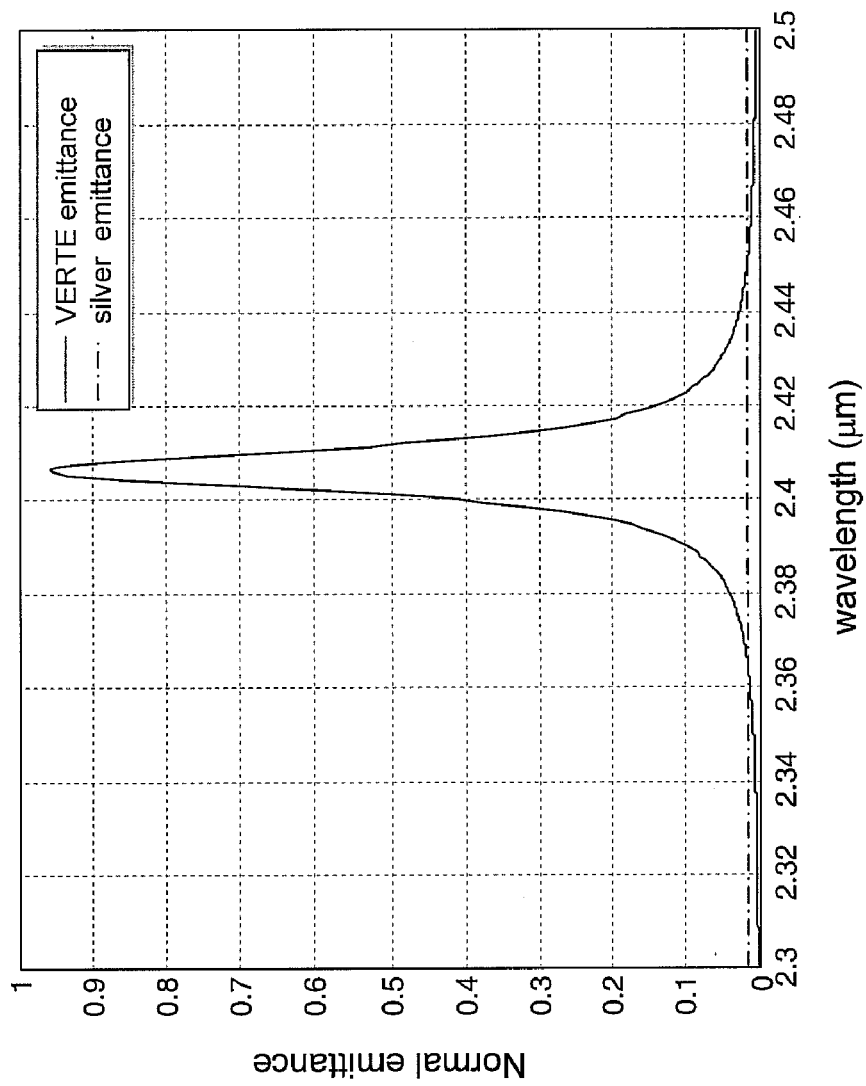
FIG. 4 is a graph demonstrating the normal emittance of vertical-cavity enhanced resonant thermal emitter with silver and normal emittance of planar silver.

Two exemplary embodiments of vertical-cavity enhanced resonant thermal emitters have been designed, namely Air-L (LH)$^n$-tungsten, and Air-L(LH)$^n$-silver. The normal emittance for the tungsten structure is given in FIG. 3. One can notice the emittance of near one at the resonance, with full width at half maximum (FWHM) of approximately 51 nm. In comparison with the normal emittance of planar tungsten, given in FIG. 3, the resonant structure has enhanced the emission of the tungsten more than thirteen times. Apart from the resonant enhancement, VERTE also further suppressed the radiation in the stop-band. The normal emittance for the silver structure, given in FIG. 4, exhibits a narrower resonant emittance peak with FWHM of 11 nm, which was expected due to lower losses in the silver resulting in much larger Q of the cavity. Again, notice that the normal emittance of the planar silver in FIG. 4 is enhanced more than fifty eight times.

Figure 5:
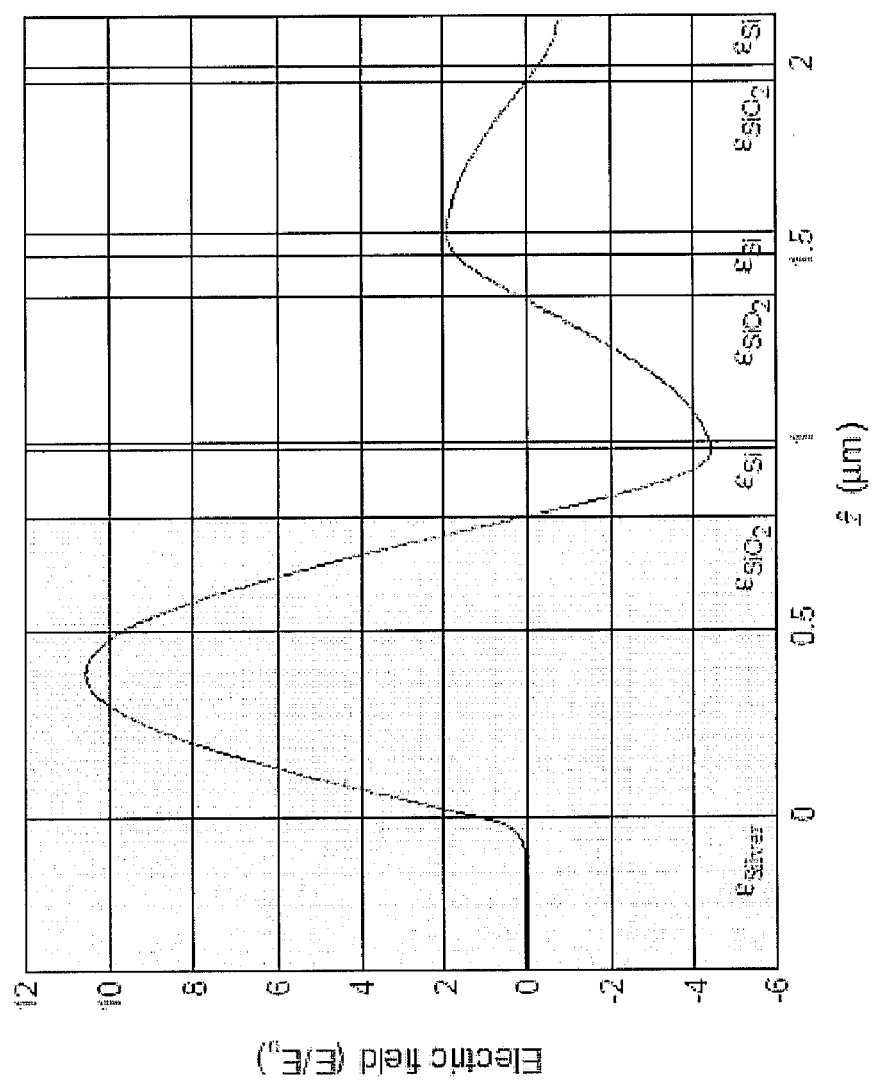
FIG. 5 is a graph demonstrating the normalized electric field in VERTE when excited by plane wave at the resonant frequency.

In order to gain further insight into the mechanisms of resonant enhancement of thermal emission the electric field is simulated inside the structure that is excited by a normally incident plane wave at the resonance as shown in FIG. 5. One can notice the resonant enhancement of the electric field inside the cavity that leads to increased penetration depth into the metal allowing for near perfect coupling of radiation from VERTE to air.

Figure 6:
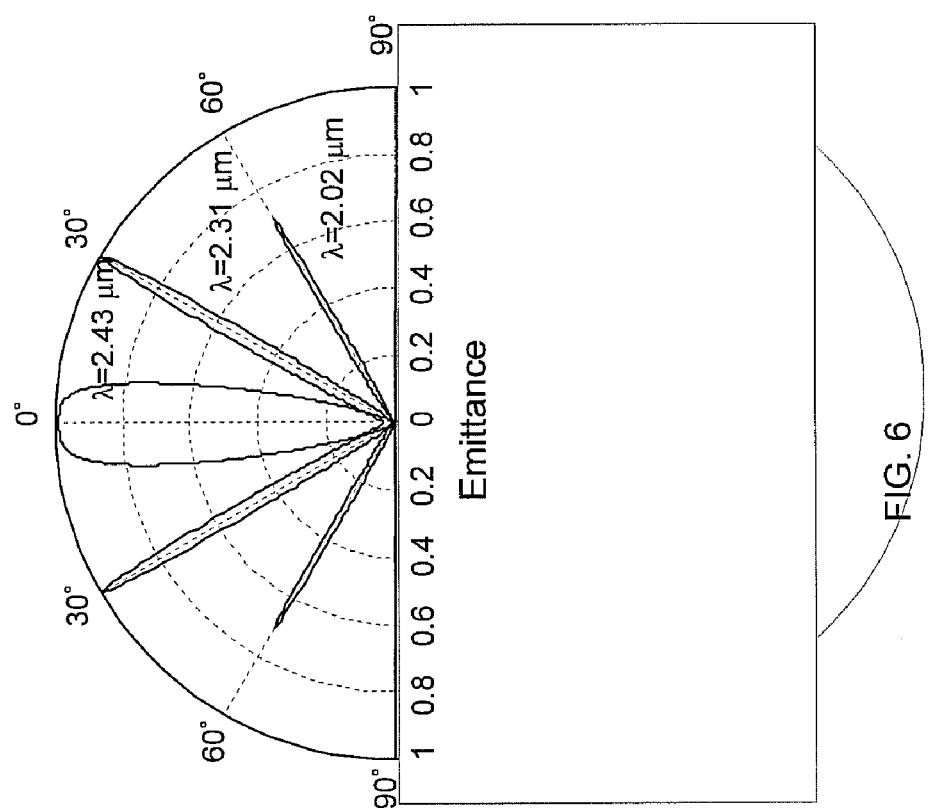
FIG. 6 is a graph demonstrating a polar plot of tungsten-VERTE emittance (for TE polarization) at different wavelengths.
Figure 7:
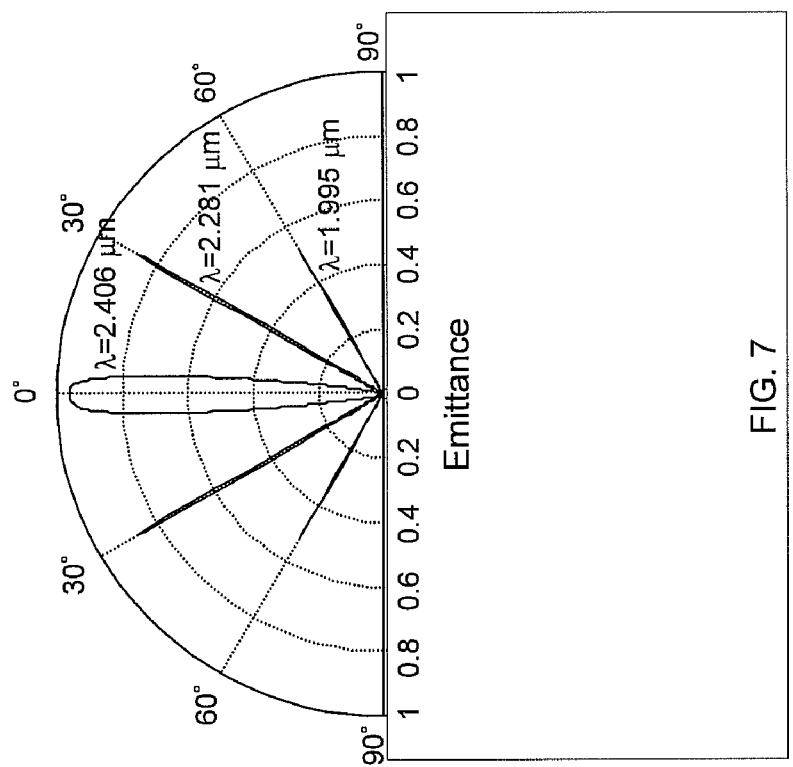
FIG. 7 is a graph demonstrating a polar plot of silver-VERTE emittance for TE polarization at different wavelengths.

Another interesting phenomenon is the level of directionality of the emittance for both structures. Polar emittance plots at three different wavelengths for silver and tungsten VERTE are shown in FIG. 6 and FIG. 7 respectively. Narrow angular lobe emission is even more interesting if one bear in mind that the coherence length of the source is inversely proportional to the angular beam width. Therefore, from the angular width of the emission pattern of θ=3° (for silver VERTE at normal incidence, FIG. 7) one can estimate the coherence length of λ/θ≈20λ. Since the angular width of the resonant peak is inversely proportional to the quality factor of the cavity, different material choice and different operating resonant frequency can provide larger quality factors and consequently even longer coherence lengths. This indeed is an interesting result suggesting that one can engineer temporal and spatial coherence properties of certain thermal sources.

The analysis presented uses optical properties of dielectrics, semiconductors and metals at room temperature and it did not take into account their temperature dependence. The question that naturally arises is how robust the performance of VERTE is with respect to the change in optical properties of the used materials at higher temperatures. In particular, estimating optical properties of tungsten, silver, silicon and silicon dioxide as a function of temperature is very important. Since optical properties of these materials at higher temperatures are not well characterized, it is very difficult to obtain exact results. Therefore, in order to gain better insight into the design robustness one can perform sensitivity analysis to establish bounds on performance of the proposed inventive design. First, lets introduce temperature dependent dielectric constants for silver, tungsten, silicon and silicon dioxide.

Reflectivity of silver, tungsten and other metals in IR and near-IR wavelength range is a decreasing function of temperature. Therefore, the emittance of these materials will increase at high temperatures. To model the temperature dependence of silver and tungsten one can use dielectric function given by the free-electron/Drude model:

$$\varepsilon(\omega) = 1 - \left(\frac{\omega_p^2}{\omega(\omega - i\omega_c)}\right) \qquad \text{Eq. 6}$$

where ω is the frequency, $\omega_p$ is the plasma frequency and $\omega_c$ is the electron collision frequency. Increase in temperature causes the increase of the electron collision frequency ($\omega_c$) thus increasing the absorption in the metal. Plasma frequency $\omega_p$, on the other hand, is approximately modeled as a constant over the range of temperatures. Silver dielectric function is approximately modeled with Eq. 6 where $\omega_p$=8.28 eV, and $\omega_c(T)=(\omega_c(T=300)/300^{1.3})T^{1.3}$ where $\omega_c(T=300)$=0.048 eV.

The temperature dependent absorption in silicon layers is modeled by means of the absorption coefficient as $$\alpha = 4.15 \cdot 10^{-5}\lambda^{1.51}T^{2.95}\exp\left(\frac{-7000}{T}\right) \qquad \text{Eq. 7}$$

where λ is in μm, T is in K and α is in cm$^{-1}$, while refractive index is assumed to be temperature independent ($n_{Si}$=3.34).

As for the SiO$_2$, it was shown that the absorption coefficient can be neglected up to 4 μm wavelength, which covers the operating range. Therefore, it will be assumed that SiO$_2$ is an ideal dielectric with negligible losses.

Figure 8:
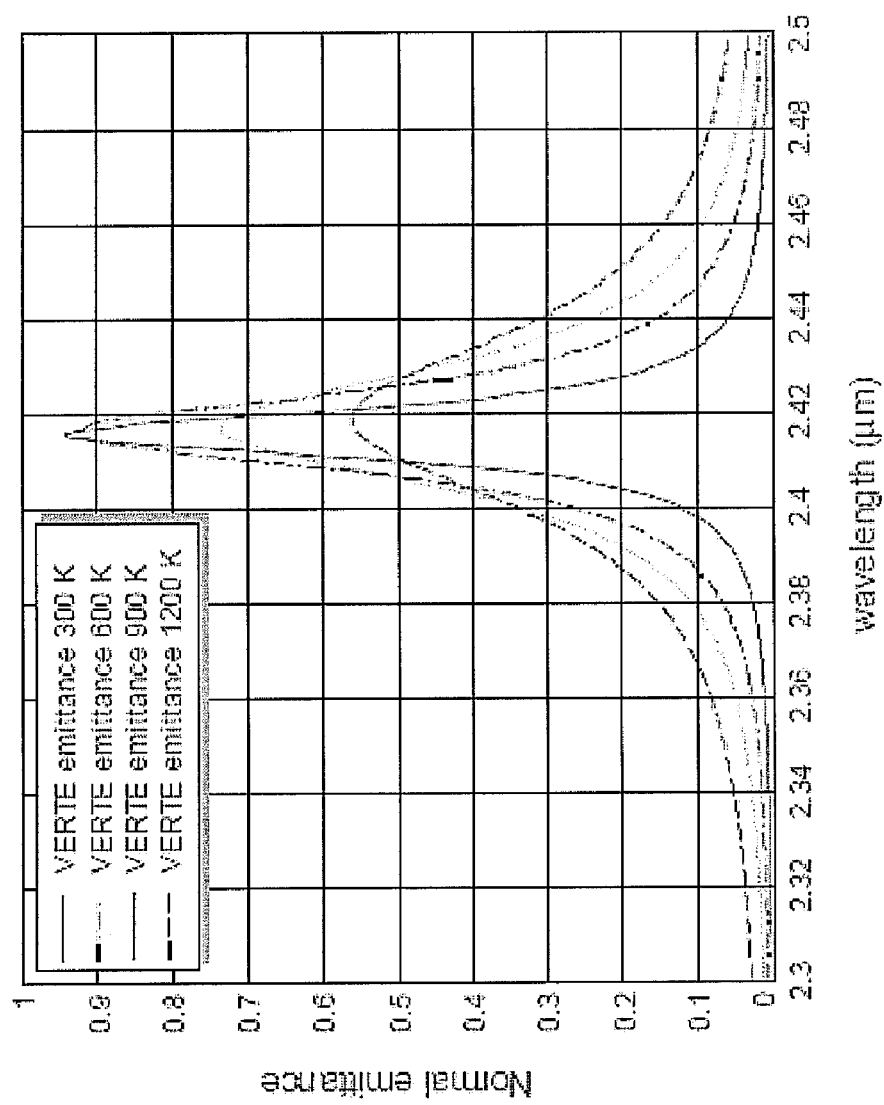
FIG. 8 is a graph demonstrating the normal emittance of a VERTE structure $L^2$ $(LH)^3$-silver structure for 300, 600, 900 and 1200 K.

Now, one can use temperature dependent dielectric functions for numerical simulations of the temperature dependent emittance of VERTE. The normal emittance of L$^2$ (LH)$^3$-silver structure at 300, 600, 900 and 1200 K is given in FIG. 8. Notice that in order to compensate for increased cavity losses an additional L layer is added). Normal emittance of VERTE decreases as the temperature increases due to the increase in the cavity losses. Resonant peak spreading can be observed in FIG. 8 as well, which is caused by the reduction of internal quality factor of the cavity. However, the emittance change is relatively small and the resonant nature is well preserved even at these temperatures. For a given operating temperature and resonant wavelength VERTE can be optimized to exhibit unity emittance by adjusting the number of PhC layers and/or the index contrast of dielectric materials used.

It will be appreciated that one can observe the resonant emission peak shift towards longer wavelengths as the operating temperature is increased. This anomaly is due to the increase in the skin depth of the underlaying silver layer which increases the effective resonant cavity length and shifts resonant mode towards longer wavelengths.

It has been demonstrated that the invention is a new kind of tunable, quasi-coherent, narrow-band thermal radiation source that is suitable for the near-IR and IR range. A thin-film structure is proposed, based on a vertical cavity and one-dimensional photonic crystal, and demonstrated (by numerical simulation) a narrow angular emission lobe at the designed wavelength with near unity emittance at the resonance. Furthermore, one can enhance the directional emittance of a low-emittance material to unity using the vertical cavity concept. The temperature dependent emittance of the inventive structure does not significantly deviate from the room temperature emittance. The shift of the emittance peak towards longer wavelengths as the temperature is increased, which appears to be counter-intuitive from the blackbody radiation point of view.

Although, resonant-antenna-like thermal emission has been observed before, this invention presents a tunable, quasi-coherent, narrow-band thermal emission source based on a thin-film structure. Near-IR and mid-IR light sources are used in a variety of gas sensors, chemical analyzers and spectrophotometric devices. However, VERTE as a very narrow-band tunable source holds great potential to make these devices smaller, more efficient, and more sensitive. It paves the way towards further integration and miniaturization of on-chip sensors and infrared sources. On a different note, this is another example how sub-micron structures interact with thermal radiation creating new radiation patterns, increasing coherence length and changing widely accepted notion of incoherent, isotropic and broadband thermal radiation sources.

Although the present invention has been shown and described with respect to several preferred embodiments thereof, various changes, omissions and additions to the form and detail thereof, may be made therein, without departing from the spirit and scope of the invention.

What is claimed is:

1. A narrow frequency band thermal radiation device based on a resonant cavity structure that comprises:
    a transparent medium for allowing thermal radiation enhancement;
    a reflective substantially non-absorbing structure that is positioned on one side of said cavity structure, said reflective non-absorbing structure acting as a first mirror for said cavity structure; and
    a reflective mirror structure that is positioned on another side of said cavity structure and acting as both the high-temperature source of radiation and a second mirror for said cavity structure, said reflective mirror structure comprises a metallic mirror; wherein
    said cavity structure includes a frequency dependant transfer function that enhances thermal emission originating from said metallic mirror building a quasi-monochromatic field while suppressing non-resonant frequencies.

2. The narrow frequency band thermal radiation device of claim 1, wherein said reflective substantially non-absorbing structure comprises a one or more dielectric layers with different dielectric constants such that the said reflective substantially non-absorbing structure is reflective and substantially non-absorbing near the resonant wavelength of the said cavity structure.

3. The narrow frequency band thermal radiation device of claim 1, wherein first said reflective reflective substantially non-absorbing structure comprises a one-dimensional photonic crystal with at least two dielectric materials that provide a periodic variation in the dielectric constant such that the photonic crystal exhibits large omnidirectional reflection near the resonant wavelength of the said cavity structure.

4. The narrow frequency band thermal radiation device of claim 1, wherein said reflective substantially non-absorbing reflective structure comprises a two-dimensional photonic crystal with at least two dielectric materials that provide a periodic variation in the dielectric constant such that the photonic crystal exhibits large reflection near the resonant wavelength of the said cavity structure.

5. The narrow frequency band thermal radiation device of claim 1, wherein said reflective substantially non-absorbing comprises of a three-dimensional photonic crystal with at least two dielectric materials that provide a periodic variation in the dielectric constant such that the photonic crystal exhibits large reflection near the resonant wavelength of the said cavity structure.

6. The narrow frequency band thermal radiation device of claim 1, wherein said transparent medium comprises air.

7. The narrow frequency band thermal radiation device of claim 1, wherein said transparent medium comprises a dielectric layer.

8. The narrow frequency band thermal radiation device of claim 1, wherein said a reflective mirror structure comprises a reflective material with non-zero imaginary part dielectric constant.

9. The narrow frequency band thermal radiation device of claim 1, wherein said reflective mirror structure comprises a metal layer.

10. A method for producing a narrow frequency band thermal radiation device comprising:
    providing a cavity structure that comprises a cavity medium for allowing thermal radiation enhancement;
    positioning a reflective substantially non-absorbing structure on one side of said cavity structure; and
    positioning a reflective mirror structure on another side of said cavity structure that acts as both the high-temperature source of thermal radiation and as a second mirror for said cavity structure; and
    heating said reflective mirror structure that comprises a metallic mirror and said cavity structure includes a frequency dependant transfer function that enhances thermal emission originating from said metallic mirror building a quasi-monochromatic field while suppressing non-resonant frequencies.

11. The method of claim 10, wherein said reflective mirror structure comprises a layer of metal.

12. The method of claim 10, wherein heating said reflective mirror structure comprises resistive heating said reflective mirror structure by applying a voltage.

13. The method of claim 10, wherein heating said reflective mirror structure comprises heating the mirror structure with a combustion heat or other heat source.

14. The method of claim 10, wherein said reflective substantially non-absorbing structure comprises a one-dimensional photonic crystal structure with periodic variation of dielectric constant.

15. The method of claim 10, wherein said reflective substantially non-absorbing structure comprises a one-dimensional photonic crystal structure that consists of two alternating dielectric materials.

16. The method of claim 15, wherein said cavity layer comprises the same low dielectric material used in the one dimensional photonic crystal; wherein the thickness of the cavity layer is twice the thickness of the layer in the photonic crystal.

17. The method of claim 15, wherein said the cavity layer comprises the same materials as said any of said alternative dielectric materials, where the thickness of the cavity layer is twice the thickness of the layer in the photonic crystal.

18. A thermal emitter device:
a cavity structure that comprises an active medium for allowing thermal emissions to occur;
a photonic crystal structure that is positioned on one side of said cavity structure, said photonic crystal structure comprises alternating layers of high index and low index materials and acts as a first mirror for said cavity structure, high and low index layers comprise a size of a quarter wavelength; and
a reflective mirror structure that is positioned on another side of said cavity structure and acting as both the high-temperature source of radiation and a second mirror for said cavity structure, said reflective mirror structure comprises a metallic mirror; wherein
said cavity structure includes a frequency dependant transfer function that enhances thermal emission originating from said metallic mirror building a quasi-monochromatic field while suppressing non-resonant frequencies.

19. The thermal emitter of claim 18, wherein said high index layers comprise Si.

20. The thermal emitter of claim 18, wherein said low index layers comprise $SiO_2$.

21. The thermal emitter of claim 18, wherein said reflective mirror structure comprises silver.

22. The thermal emitter of claim 18, wherein said reflective mirror structure comprises tungsten.

23. The thermal emitter of claim 18, wherein said photonic crystal structure comprises a one dimensional photonic crystal structure.

24. The thermal emitter of claim 18, wherein said cavity structure comprises $SiO_2$.

25. The thermal emitter of claim 18, wherein said photonic crystal structure comprises a mid-bandgap less than 10 μm.

26. A method of forming a thermal emitter device:
providing a cavity structure that comprises an active medium for allowing thermal emissions to occur;
positioning a photonic crystal structure on one side of said cavity structure, said photonic crystal structure comprises alternating layers of high index and low index materials and acts as a first mirror for said cavity structure, said high and low index layers comprise a size of a quarter wavelength; and
positioning a reflective mirror structure on another side of said cavity structure and acting as both the high-temperature source of radiation and a second mirror for said cavity structure, said reflective mirror structure comprises a metallic mirror and said cavity structure includes a frequency dependant transfer function that enhances thermal emission originating from said metallic mirror building a quasi-monochromatic field while suppressing non-resonant frequencies.

27. The method of claim 26, wherein said high index layers comprise Si.

28. The method of claim 26, wherein said low index layers comprise $SiO_2$.

29. The method of claim 26, wherein said reflective mirror structure comprises silver.

30. The method of claim 26, wherein said reflective mirror structure comprises tungsten.

31. The method of claim 26, wherein said photonic crystal structure comprises a one dimensional photonic crystal structure.

32. The method of claim 26, wherein said cavity structure comprises $SiO_2$.

33. The method of claim 26, wherein said photonic crystal structure comprises a mid-bandgap less than 10 μm.

* * * * *